United States Patent
Watadani et al.

(10) Patent No.: US 6,838,371 B2
(45) Date of Patent: Jan. 4, 2005

(54) METHOD OF MANUFACTURING SEMICONDUCTOR DEVICE

(75) Inventors: Takashi Watadani, Hyogo (JP); Hiroshi Oshita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/653,891

(22) Filed: Sep. 4, 2003

(65) Prior Publication Data

US 2004/0192035 A1 Sep. 30, 2004

(30) Foreign Application Priority Data

Mar. 24, 2003 (JP) ........................................ 2003-080102

(51) Int. Cl.⁷ .......................................... H01L 21/4763
(52) U.S. Cl. ...................... 438/626; 438/633; 438/692
(58) Field of Search ................................. 438/618–699

(56) References Cited

U.S. PATENT DOCUMENTS

| | | | |
|---|---|---|---|
| 5,502,008 A | * | 3/1996 | Hayakawa et al. ......... 438/675 |
| 5,726,099 A | | 3/1998 | Jaso |
| 6,045,435 A | * | 4/2000 | Bajaj et al. .................... 451/41 |
| 2004/0053499 A1 | * | 3/2004 | Liu et al. .................... 438/689 |

FOREIGN PATENT DOCUMENTS

JP    P2001-210612 A    3/1998

* cited by examiner

*Primary Examiner*—H. Jey Tsai
(74) *Attorney, Agent, or Firm*—McDermott Will & Emery LLP

(57) ABSTRACT

At the time of performing a polishing process on a tungsten film and a silicon oxide film, based on the relation between a residual step and pattern density preliminarily obtained while changing polishing parameters, from pattern density of plugs in the polishing step and a predetermined residual step required, polishing parameters are determined so that a residual step does not exceed a predetermined residual step "h". With the determined polishing parameters, the polishing process is performed on the tungsten film and the silicon oxide film so that the films are planarized, and plugs are formed in contact holes. As a result, a semiconductor device in which a step does not exceeds a predetermined residual step by a polishing process is obtained.

5 Claims, 11 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device, including a polishing process.

2. Description of the Background Art

In manufacture of a semiconductor device, to realize a fine pattern at the time of forming a plug or a metal line, a step in an under layer on which a predetermined metal film for forming a plug or the like is formed is reduced.

As a method of reducing a step in an under layer, chemical mechanical polishing (hereinafter, simply described as "polishing") is used. As a conventional semiconductor device manufacturing method, polishing described in Japanese Patent Laying-Open No. 2001-210612 will be described.

First, a metal such as tungsten is deposited on a semiconductor substrate and a predetermined metal pattern is formed by photolithography. An interlayer insulating film is formed on a semiconductor substrate so as to cover the metal pattern.

After that, by photolithography, a plurality of via holes exposing the metal pattern are formed in the interlayer insulation layer. The plurality of via holes are sequentially filled with a barrier film made of titanium or the like and a metal layer made of tungsten or the like.

By performing polishing with a non-selective slurry, the metal layer, barrier layer, and interlayer insulating film are removed and the interlayer insulating film with the flat surface is formed. In each of the plurality of via holes, a via plug of which upper surface is flat is formed. In such a manner, a step in the under layer in the conventional semiconductor device is reduced.

However, the conventional semiconductor device manufacturing method using the polishing has the following problems. The plurality of via plugs are formed in the via holes provided in a predetermined region in the insulating film on the basis of a layout pattern.

At this time, when the polishing process is performed on a region (region A) in which the plurality of via plugs and an insulating film surrounding the via plugs are positioned and a region (region B) in which no via plug is formed and only the insulating film is positioned, the difference (residual step) between the level of the top face of region A and that of the top face of region B after the polishing process occurs depending on pattern density of the via plugs.

Consequently, a problem occurs such that some residual step becomes large to a degree that it cannot be permitted in a photolithography process performed later. The pattern density will be defined later.

When there are a plurality of polishing processes, depending on the residual step which occurs in the first polishing process, there is a case that a residue of a metal film occurs in the step portion in a polishing process performed later. There is consequently the possibility that electric short-circuit occurs via the residue of the metal film.

SUMMARY OF THE INVENTION

The present invention has been achieved to solve the problems and its object is to provide a method of manufacturing a semiconductor device, including a polishing process in which polishing parameters are determined so that a residual step does not exceed a predetermined residual step required.

A method of manufacturing a semiconductor device according to the present invention includes the steps of: forming an insulating film on a main surface of a semiconductor substrate; forming an opening for forming a predetermined conducive pattern in the insulating film; forming a conductive film on the insulating film so as to bury the opening; and performing a polishing process on the conductive film and the insulating film by using a slurry having the function of polishing both the conductive film and the insulating film, thereby leaving the conductive film in the opening to form the predetermined conductive pattern. In the polishing step of forming the predetermined conductive pattern, based on the relation between a residual step and pattern density of a conductive pattern preliminarily obtained while changing polishing parameters, from the pattern density of the conductive pattern in the polishing step and a required predetermined residual step, polishing parameters are determined so that a step does not exceed the predetermined residual step.

The pattern density of the conductive pattern denotes the ratio of gross area of a region in which the conductive pattern is positioned to the sum of gross area of the region in which the conductive pattern is positioned and gross area of a region in which the insulating film is positioned. The residual step denotes the difference between the level of the surface of the region in which the conductive pattern and the insulating film surrounding the conductive pattern are positioned after the polishing process and the level of the surface of the area in which the conductive pattern is not formed but only the insulating film is positioned.

In the method of manufacturing a semiconductor device according to the present invention, based on the relation between the residual step and pattern density of a conductive pattern preliminarily obtained while changing polishing parameters, from pattern density of the conductive pattern in the polishing step and the required residual step (maximum value), the polishing parameters are determined so that the residual step does not exceeds the maximum value of the residual step. By performing the polishing process with the determined polishing parameters, the conductive film and the insulating film are planarized with reliability, and the residual step can be largely reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
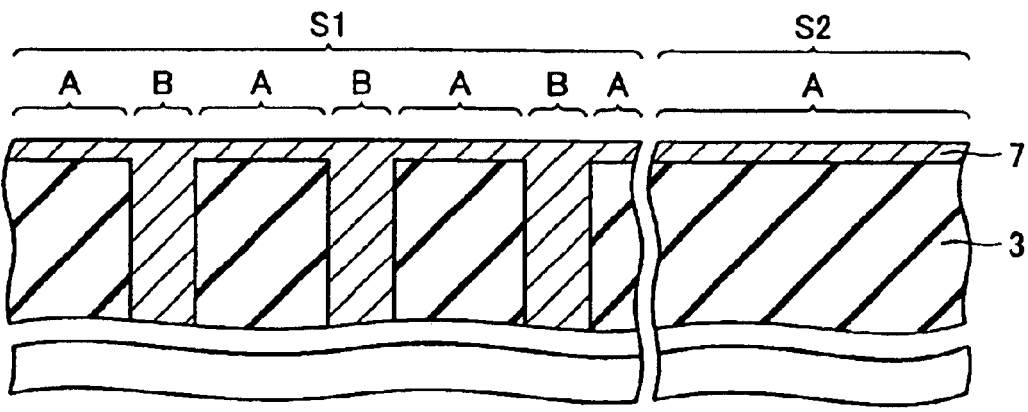
FIG. 1 is a cross section for explaining pattern density in a polishing process in a method of manufacturing a semiconductor device according to a first embodiment of the present invention.

First, dependency on pattern density of a residual step will be described. As an example, as shown in FIG. 1, the relation between pattern density of a tungsten pattern formed by a tungsten film 7 and a residual step after polishing in the case where tungsten film 7 is used as a conductive film and a silicon oxide film 3 is used as an insulating film will be described.

The pattern density of the tungsten pattern is defined by a ratio (%) of a gross area of a region B to the sum of gross area of region B in which the tungsten pattern is positioned in a region S1 in which the tungsten pattern is formed and gross area of a region A in which silicon oxide film 3 is positioned including a region S2 in which the tungsten pattern is not formed in the polishing process.

On the other hand, pattern density of silicon oxide film 3 is defined as a ratio (%) of gross area of region A to the sum of gross area of region A and gross area of region B.

Figure 2:
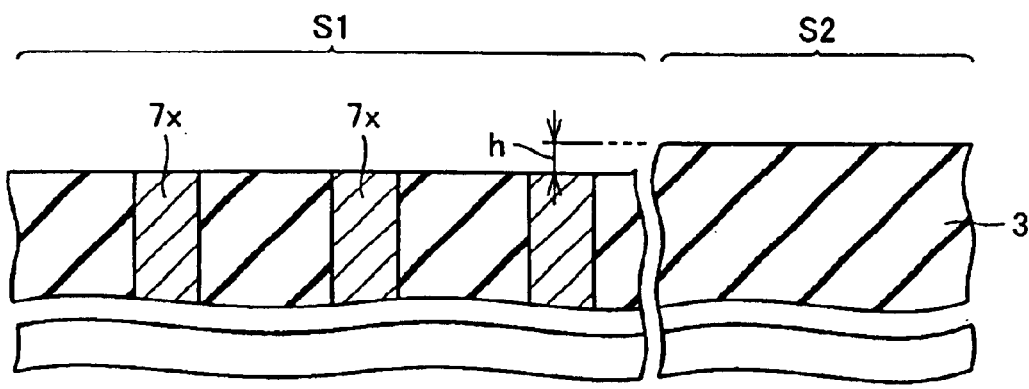
FIG. 2 is a cross section illustrating a residual step in the polishing process in the first embodiment.

As shown in FIG. 2, the residual step is defined as the difference "h" between the level of the surface of region S1 in which a tungsten pattern 7x is formed after the polishing process (the region in which tungsten pattern 7x and silicon oxide film 3 surrounding tungsten pattern 7x are positioned) and the level of the surface of region S2 in which the tungsten pattern is not formed.

The tungsten pattern serves as a dummy pattern and polishing process is performed in both of the case where line-shaped grooves formed at predetermined intervals in a silicon oxide film on a semiconductor substrate are filled with tungsten to form a line-shaped tungsten pattern and the case where an opening (hole) formed in the silicon oxide film is filled with tungsten to form a plug.

The polishing process is performed by using a slurry having the function of polishing both tungsten film 7 and silicon oxide film 3.

Figure 3:
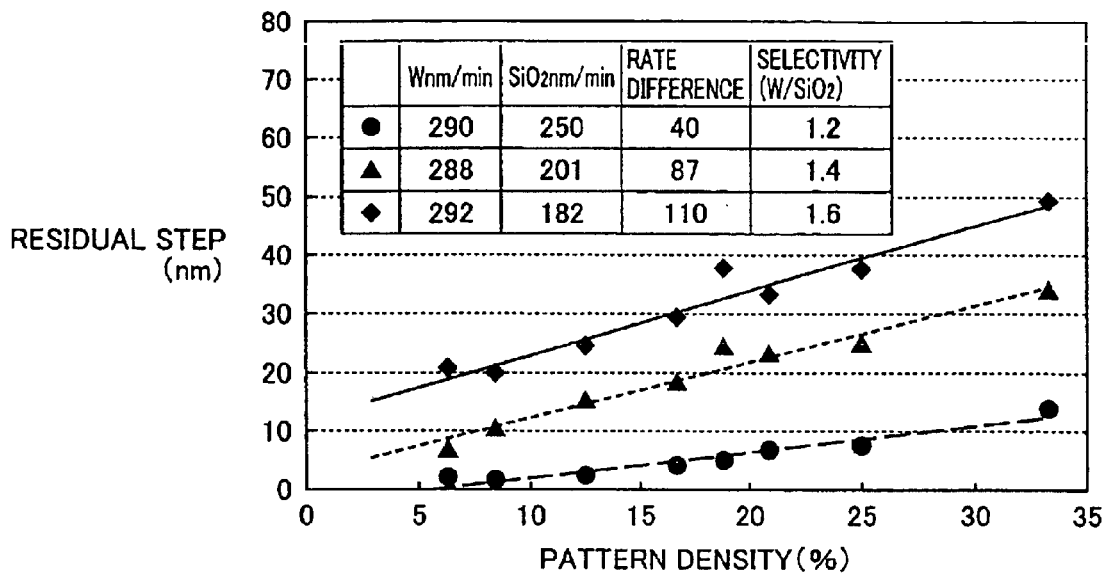
FIG. 3 is a first graph showing dependency on pattern density of the residual step in the first embodiment.

FIG. 3 shows an example of the relation between pattern density of the tungsten pattern and a residual step formed after the polishing process. The lateral axis indicates the pattern density of the tungsten pattern, and the vertical axis denotes a residual step.

FIG. 3 shows a graph of dependency on pattern density of the residual step with respect to the cases where the ratio (selectivity) between polishing speed of tungsten and polishing speed of the silicon oxide film is about 1.2, about 1.4, and about 1.6.

It is understood from the graphs that as the pattern density increases, the residual step tends to increase. At the same pattern density, the higher the selectivity is, the larger the residual step tends to be.

Figure 4:
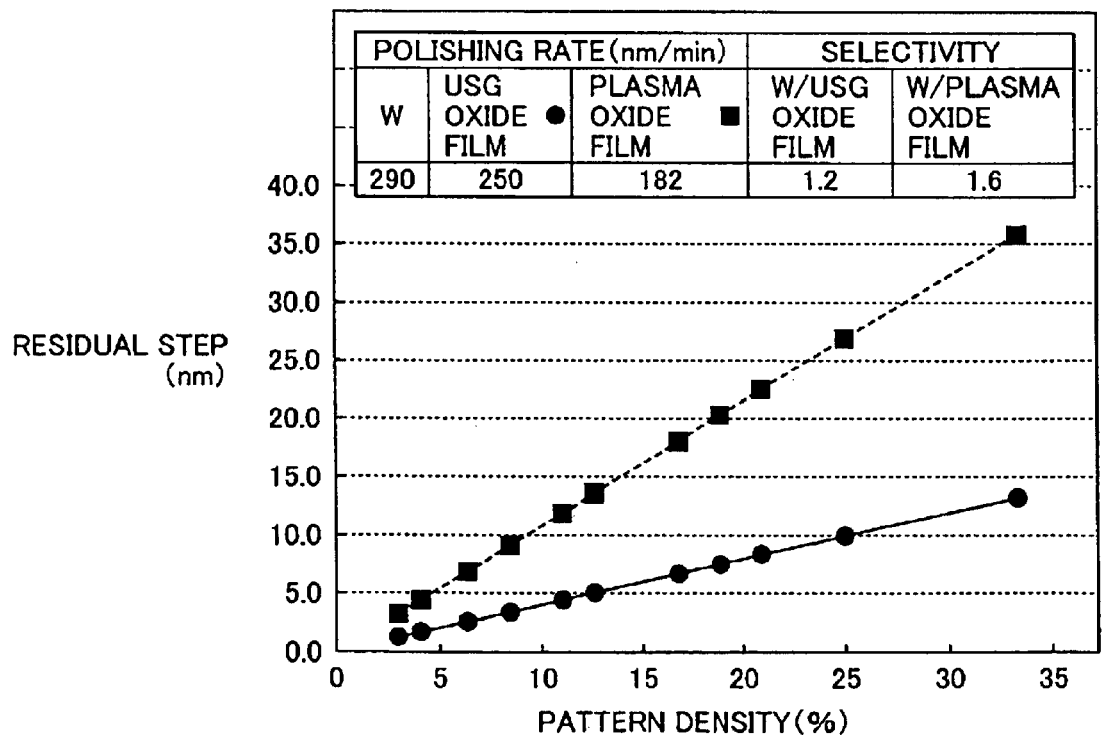
FIG. 4 is a second graph showing dependency on pattern density of the residual step in the first embodiment.

FIG. 4 shows another example of the relation between pattern density of tungsten and a residual step after the polishing process. FIG. 4 shows the graph of dependency on pattern density of a residual step by kind of the insulating film. As insulating films, an undoped silicon oxide film (undoped silicate glass (USG) film) and a silicon oxide film formed by plasma CVD (plasma silicon oxide film) were used.

The polishing speed of the undoped silicon oxide film is about 250 nm/min and that of the plasma silicon oxide film is about 182 nm/min. The polishing speed varies according to the kind of the insulating film.

FIG. 4 shows a graph of dependency on pattern density of a residual step in the cases where the ratio (selectivity) between polishing speed of tungsten and polishing speed of the insulating film is about 1.2 and about 1.6.

It is understood from the graphs that as the pattern density increases, the residual step tends to increase and the gradient of the graph varies according to the kind of the insulating film. In this case, the gradient of the graph in the case of using the plasma silicon oxide film is larger than that in the case of using the undoped silicon oxide film.

As described above, it is understood that selectivity can be changed by changing the kind of the insulating film and, even if pattern density is not changed, by changing the kind of the insulating film, the residual step can be adjusted.

Similar evaluations were made on, as the kinds of insulating films other than the undoped silicon oxide film and the plasma silicon oxide film, a TEOS (Tetra Ethyl Ortho Silicate glass) film formed by plasma CVD, an undoped silicon oxide film (USG film) formed by atmospheric pressure CVD, a PSG (Phospho Silicate Glass) film formed by atmospheric pressure CVD, an HDP (High Density Plasma) film formed by plasma CVD, and BPTEOS (Boro Phospho Tetra Ethyl Ortho Silicate glass) film formed by atmospheric pressure CVD.

In this case, the polishing speed of the TEOS film was 180 nm/min, that of the USG film was 290 nm/min, that of the PSG film was 370 nm/min, that of the HDP film was 130 nm/min, and that of the BPTEOS film was 400 nm/min. It is understood that the gradient of the graph (not shown) changes according to the selectivity.

Figure 5:
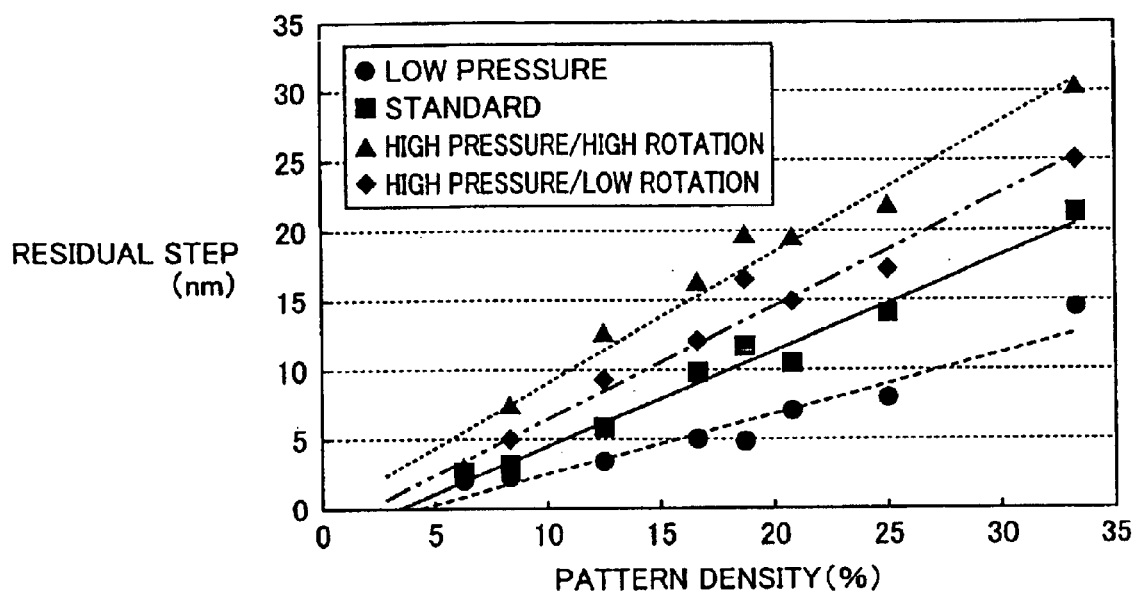
FIG. 5 is a third graph showing dependency on pattern density of the residual step in the first embodiment.

FIG. 5 shows further another example of the relation between pattern density of tungsten and the residual step after the polishing process. FIG. 5 shows a graph of dependency on pattern density of the residual step by polishing parameters on the polishing apparatus side (apparatus polishing parameter).

Figure 6:
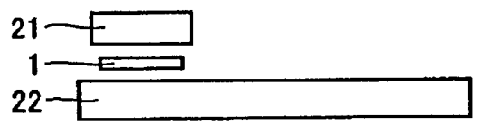
FIG. 6 is a side view schematically showing the configuration of a polishing apparatus in the first embodiment.
Figure 7:
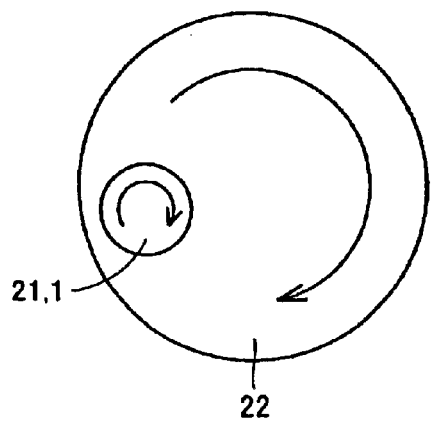
FIG. 7 is a plan view schematically showing the configuration of the polishing apparatus in the first embodiment.

The apparatus polishing parameters are, as shown in FIGS. 6 and 7, a force of pressing wafer (semiconductor substrate) 1 against a lapping plate 22 (polishing pressure) by a head 21, rotational speed of wafer 1 (head 21), and rotational speed of lapping plate 22.

FIG. 5 shows graphs of dependency on pattern density of a residual step with respect to each of four apparatus polishing parameters of a standard polishing parameter, a low-pressure polishing parameter, a high-pressure/high-rotational speed polishing parameter, and a high-pressure/low-rotational speed polishing parameter. The standard polishing parameter is that polishing pressure is 2 to 3 psi (13.8 to 20.7 kPa), rotational speed of the head is 80 to 120 rpm, and rotational speed of the lapping plate is 80 to 120 rpm. The low-pressure polishing parameter is that the polishing pressure is 1 to 2 psi (6.9 to 13.8 kPa). The high-pressure/high rotational-speed polishing parameters are that polishing pressure is 3 to 5 psi (20.7 to 34.5 kPa), rotational speed of the head is 120 to 150 rpm, and rotational speed of the lapping plate is 120 to 150 rpm. The high-pressure/low rotational speed polishing parameters are that polishing pressure is 3 to 5 psi, rotational speed of the head is 50 to 80 rpm, and rotational speed of the lapping plate is 50 to 80 rpm.

As each of the graphs shows, as the pattern density increases, the residual step tends to increase and it is understood that the gradient of the graph varies according to the apparatus polishing parameters.

It is understood that, as compared with the standard polishing parameters, in the case of the high-pressure/low rotational speed polishing parameters, the gradient of the graph is larger. In the case of the high-pressure/high-rotational speed polishing parameters, the gradient of the graph is further larger.

On the other hand, as compared with the standard polishing parameter, in the case of the low-pressure polishing parameter, the gradient of the graph is smaller.

Generally, the pattern density of a conductive pattern such as a plug is determined by designing, so that it cannot be basically changed. It is understood that, in such a case, by changing the kind of the insulating film or changing the apparatus polishing parameters, the residual step can be adjusted.

As described above, it is understood that the residual step largely depends on the pattern density of the conductive pattern of tungsten or the like and as the pattern density increases, the residual step tends to increase. It is also understood that, at the same pattern density, as the selectivity becomes higher, the residual step tends to increase.

Further, it is also understood that, without changing the pattern density, the residual step can be adjusted by changing the kind of the insulating film to change selectivity.

It is also understood that even when the pattern density of the conductive pattern cannot be changed from a designing viewpoint, by changing the apparatus polishing parameters, the residual step can be adjusted.

An example of the polishing process performed by applying the relation between the residual step and the pattern density preliminarily obtained while changing the polishing parameters will be described concretely.

Figure 8:
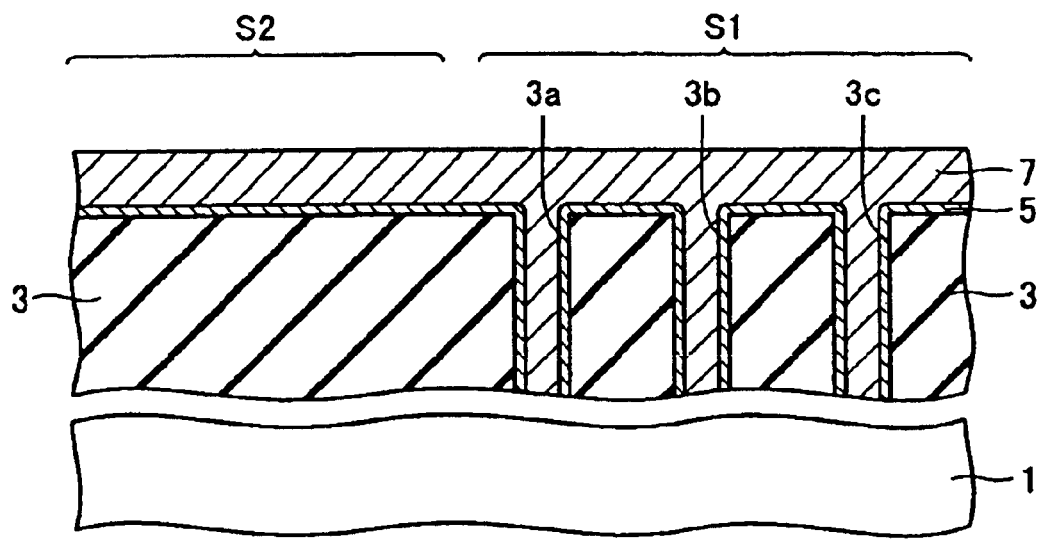
FIG. 8 is a cross section showing a process in the method of manufacturing a semiconductor device in the first embodiment.

First, as shown in FIG. 8, silicon oxide film 3 is formed on semiconductor substrate 1.

In a predetermined region in silicon oxide film 3, contact holes 3a to 3c are formed. On silicon oxide film 3 including the side faces of contact holes 3a to 3c, a barrier metal 5 such as titanium nitride is formed.

On barrier metal 5, tungsten film 7 is formed by, for example, CVD so as to bury contact holes 3a to 3c.

Subsequently, the polishing process is performed on tungsten film 7, barrier metal 5, and silicon oxide film 3. On the basis of the relation between the residual step and pattern density preliminarily obtained, from the pattern density of the plugs in the polishing process and a required predetermined residual step, polishing parameters are determined so that the residual step does not exceed the predetermined residual step.

Figure 9:
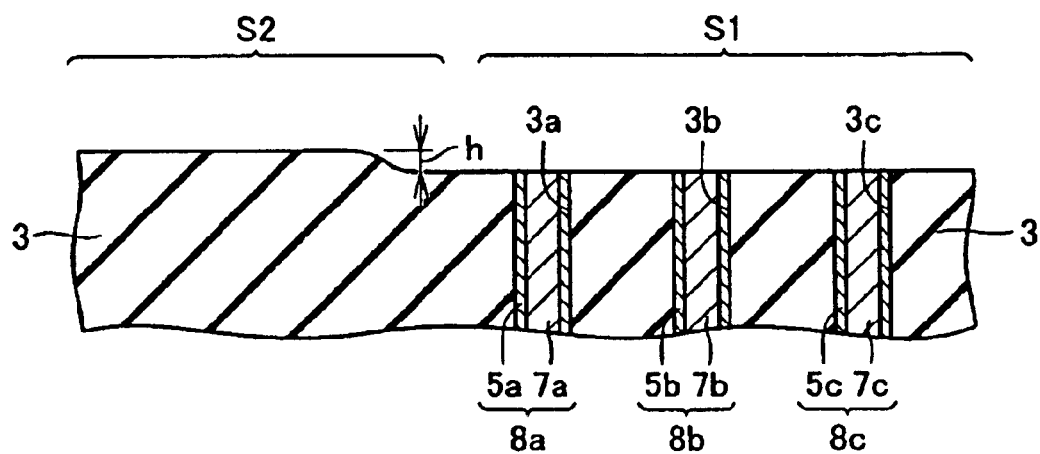
FIG. 9 is a cross section showing a process performed after the process illustrated in FIG. 8 in the first embodiment.

Concretely, the pattern density of the plugs of tungsten is calculated as a ratio (%) of area of region B to the sum of gross area of region B in which plugs 7a to 7c are positioned in region S1 in which the plugs are formed and gross area of region A in which silicon oxide film 3 is positioned including region S2 in which the tungsten pattern is not formed (refer to FIGS. 1 and 9).

The required predetermined residual step is set, as will be described later, for example, as a maximum value of a step at which a copper film is not remained in the polishing process performed later.

For example, when the pattern density of the plugs in the polishing process is set to about 30% and the maximum value of the required residual step is set to about 30 nm, on the basis of the relation of dependency on pattern density of the residual step shown in FIG. 3, it is sufficient to set the selectivity of 1.4 or less as a polishing parameter.

With the polishing parameters determined as described above, the polishing process is performed on tungsten film 7, barrier metal 5, and silicon oxide film 3 and, as shown in FIG. 9, plugs 8a to 8c including barrier metals 5a to 5c and tungsten films 7a to 7c, respectively, are formed in contact holes 3a to 3c. Since barrier metal 5 is thinner than tungsten film 7, it hardly exerts an influence on the polishing process.

The residual step "h" between the level of the surface of region S1 in which plugs 8a to 8c are formed and the level of the surface of region S2 in which plugs 8a to 8c are not formed is equal to or less than the maximum value of the required residual step.

According to the above-described manufacturing method, on the basis of the relation between the residual step and pattern density preliminarily obtained while changing the polishing parameters, the polishing parameters including selectivity are determined from the pattern density of the plugs in the step of performing the polishing process and the maximum value of the residual step required after the polishing process.

By performing the polishing process according to the polishing parameters determined as described above, the tungsten film, the silicon oxide film, and the like are planarized with reliability and the residual step can be reduced.

As a result, occurrence of a residue of the conductive film such as a copper film can be suppressed in a subsequent polishing process and higher precision of photolithography process can be achieved.

In the foregoing manufacturing method, the case of determining the polishing parameters on the basis of the relation of dependency on pattern density of the residual step shown in FIG. 3 at the time of performing the polishing process on tungsten and the silicon oxide film has been described as an example.

In the case where it is difficult to determine selectivity so that a residual step does not exceed a predetermined residual step depending on the pattern density of the pattern of plugs or the like, the polishing parameters including the kind of an insulating film can be determined so that the residual step does not exceed the predetermined residual step on the basis of the relation shown in FIG. 4 for example.

Further, even in the case where pattern density of a pattern such as plugs cannot be changed from a design viewpoint, the polishing parameters on the side of the polishing apparatus (apparatus polishing parameters) can be determined so that the residual step does not exceeds a predetermined residual step, for example, on the basis of the relation shown in FIG. 5.

Second Embodiment

A manufacturing method including another polishing process performed after the polishing process described in the first embodiment will be described.

Figure 10:
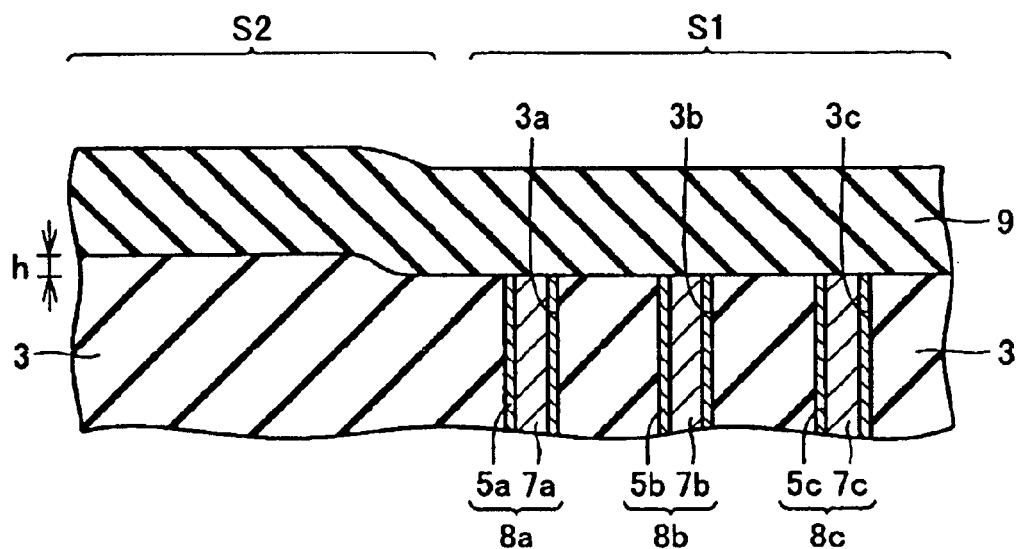
FIG. 10 is a cross section showing a process in a method of manufacturing a semiconductor device according to a second embodiment of the present invention.
Figure 11:
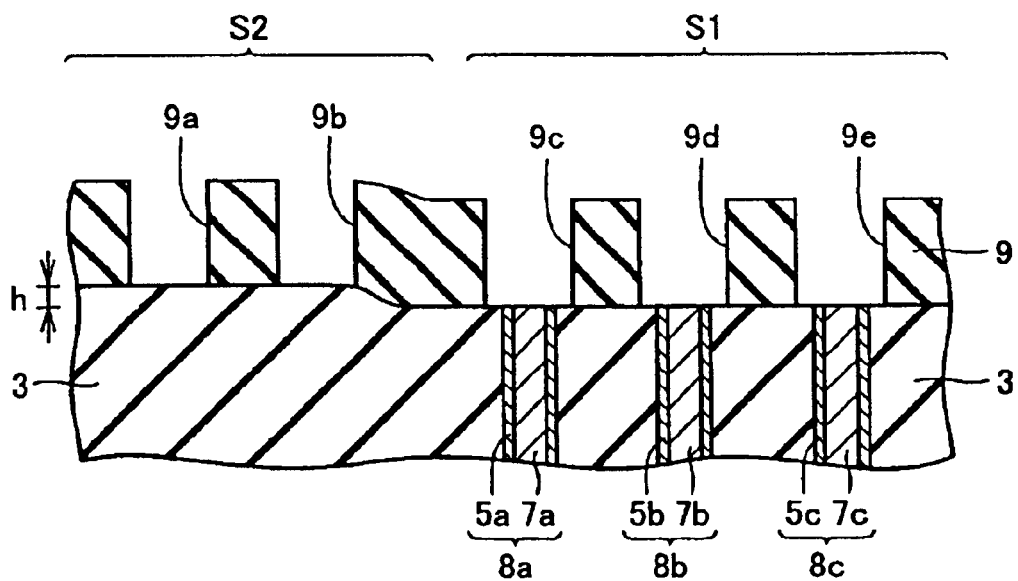
FIG. 11 is a cross section showing a process performed after the process illustrated in FIG. 10 in the second embodiment.

After the process shown in FIG. 9, as shown in FIG. 10, a silicon oxide film 9 is formed on silicon oxide film 3. As shown in FIG. 11, by performing a predetermined photolithography process and the like on silicon oxide film 9, grooves (or openings) 9a to 9e for forming lines are formed.

Figure 12:
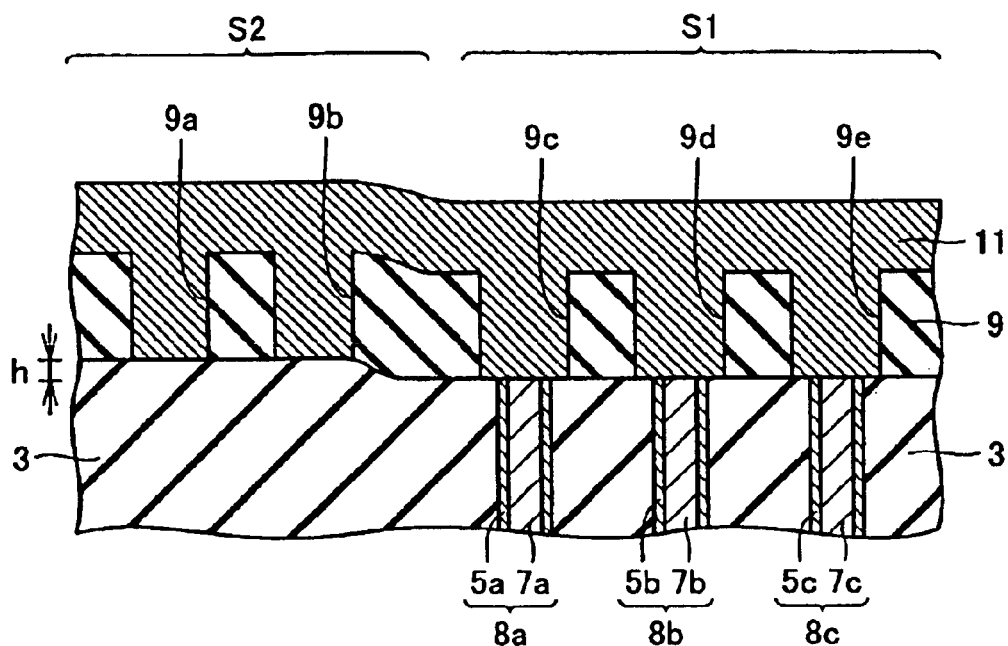
FIG. 12 is a cross section showing a process performed after the process illustrated in FIG. 11 in the second embodiment.
Figure 13:
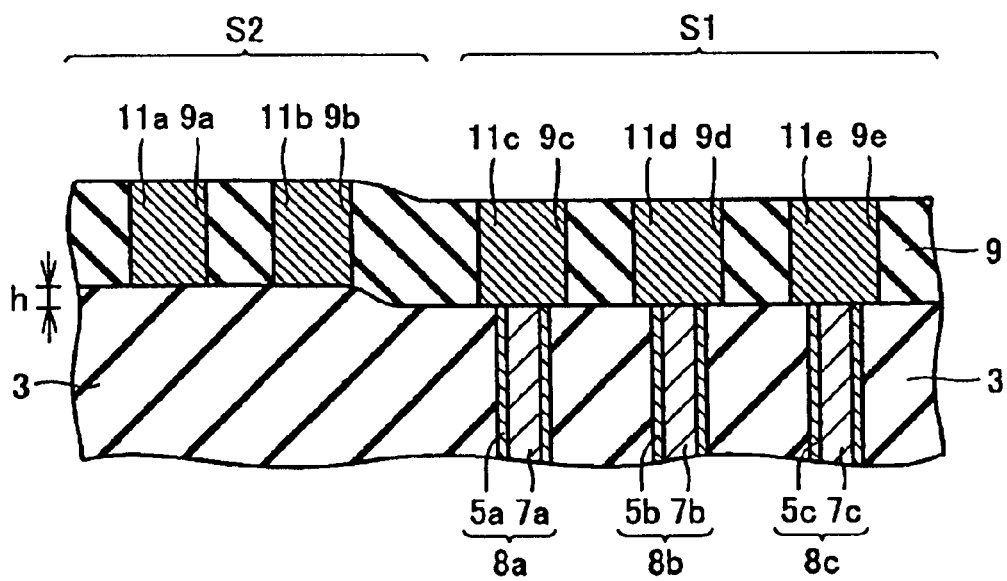
FIG. 13 is a cross section showing a process performed after the process illustrated in FIG. 12 in the second embodiment.

As shown in FIG. 12, a copper film 11 is formed on silicon oxide film 9 so as to bury grooves 9a to 9e. After that, by removing the portion of copper film 11 positioned on the top face of silicon oxide film 9 so as to leave the copper film in grooves 9a to 9e by so-called damascene, copper lines 11a to 11e are formed as shown in FIG. 13.

In the above-described manufacturing method, silicon oxide film 9 in which grooves 9a to 9e are formed for copper lines 11a to 11e is formed on the surface of silicon oxide film 3 after plugs 8a to 8c are formed as shown in FIG. 9.

At this time, by the polishing process, a residual step between region S1 in which plugs 8a to 8c are formed and region S2 in which no plug is formed is reduced. As a result, in the polishing process performed at the time of forming copper lines, occurrence of a residue of the copper film can be suppressed.

Figure 14:
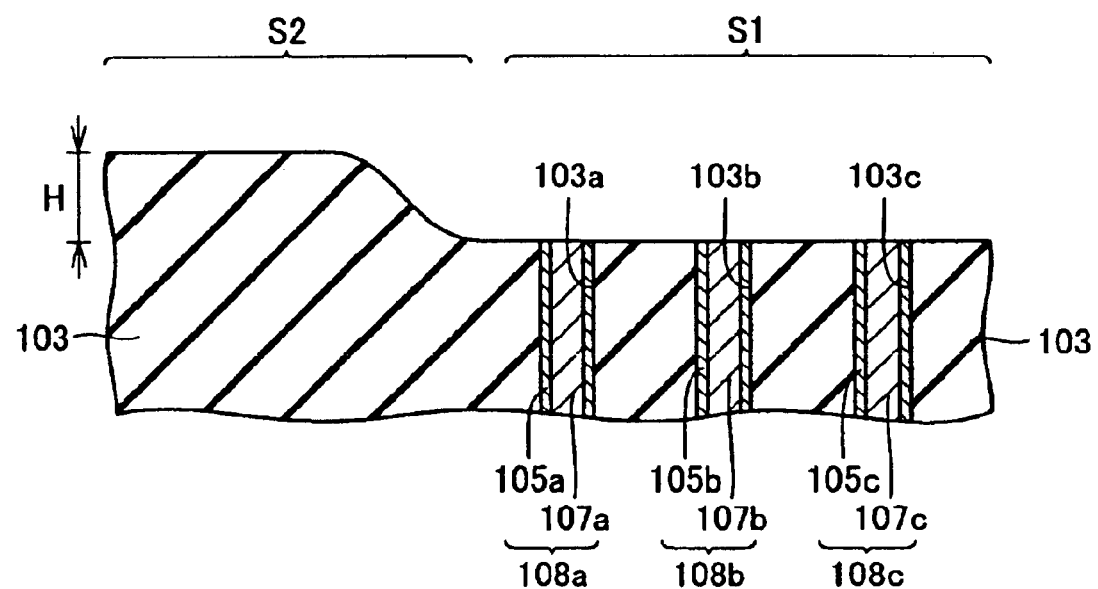
FIG. 14 is a cross section showing a process in a method of manufacturing a semiconductor device as a comparative example, in the second embodiment.

This will be described by using a comparative example. In the conventional polishing process, in the step corresponding to the step shown in FIG. 9, by performing the polishing process on the tungsten film and the like by using a slurry having the function of polishing tungsten, as shown in FIG. 14, plugs 108a to 108c including barrier metals 105a to 105c and tungsten films 107a to 107c, respectively, are formed.

At this time, in the conventional polishing process, there is no idea of setting the polishing parameters in consideration of pattern density of plugs 108a to 108c. Depending on the pattern density of plugs 108a to 108c, planarization of region S1 in which plugs 108a to 108c are formed and region S2 in which no plug is formed is not sufficiently conducted, and a relatively large residual step H occurs.

Figure 15:
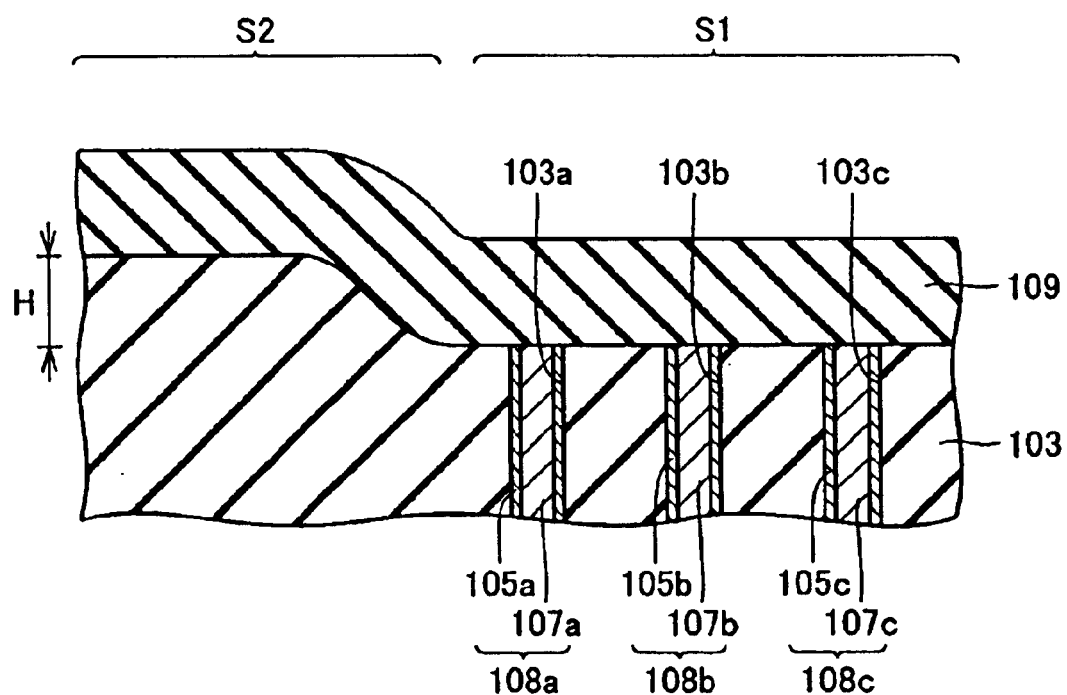
FIG. 15 is a cross section showing a process performed after the process illustrated in FIG. 14 in the second embodiment.
Figure 16:
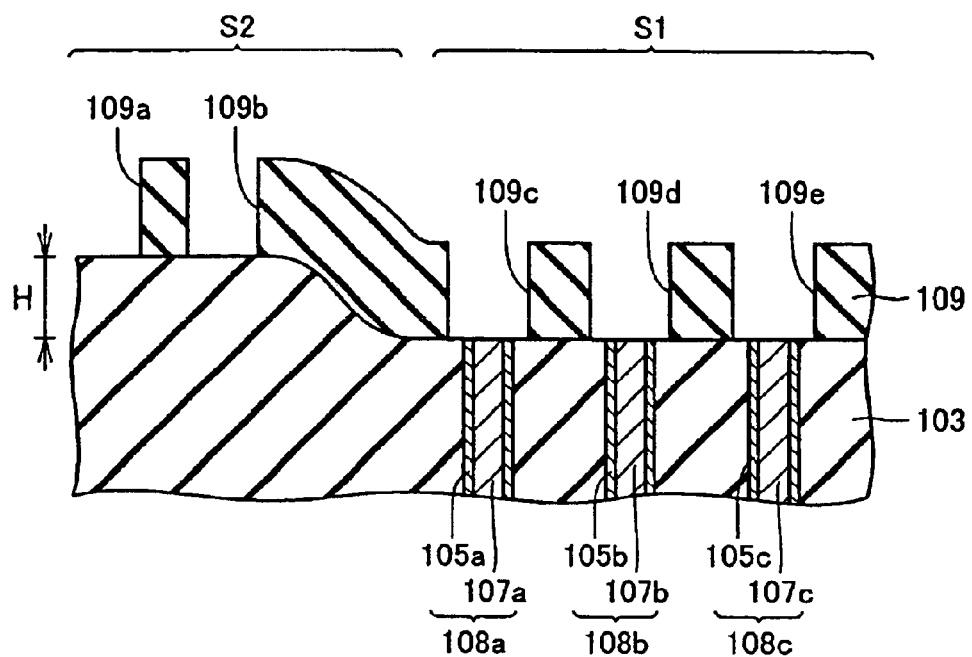
FIG. 16 is a cross section showing a process performed after the process illustrated in FIG. 15 in the second embodiment.

In a state where such a residual step H occurs, as shown in FIG. 15, a silicon oxide film 109 is further formed on silicon oxide film 103. As shown in FIG. 16, by performing a predetermined photolithography process and the like on silicon oxide film 109, grooves 109a to 109e for forming copper lines are formed.

Figure 17:
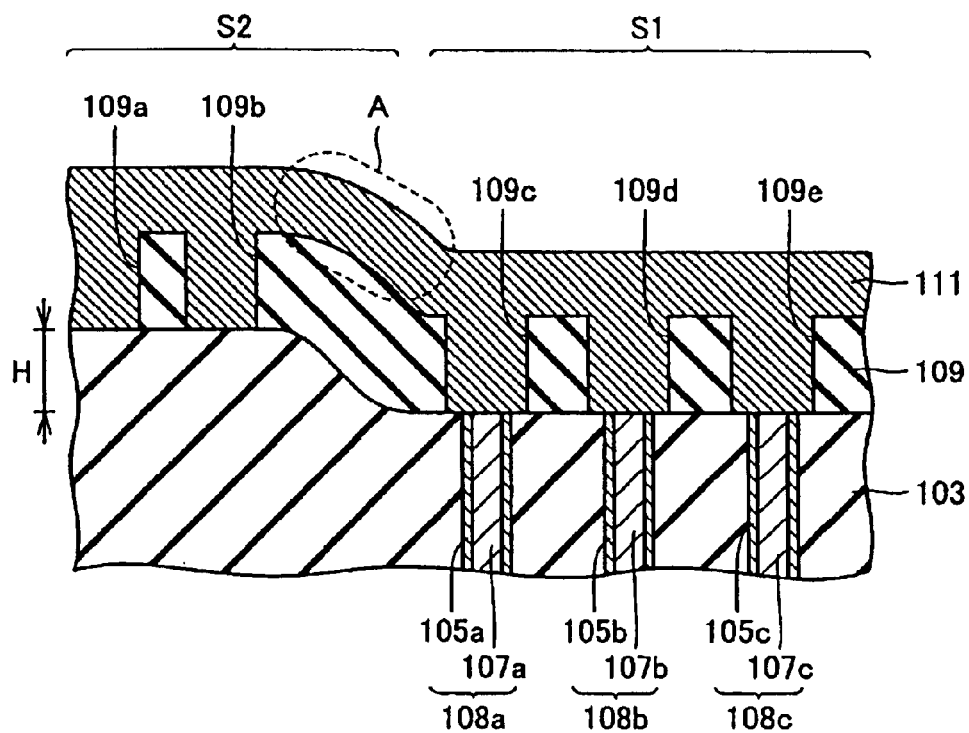
FIG. 17 is a cross section showing a process performed after the process illustrated in FIG. 16 in the second embodiment.

As shown in FIG. 17, a copper film 111 is formed on silicon oxide film 109 so as to bury grooves 109a to 109e. By the damascene method, copper lines 111a to 111e are formed in grooves 109a to 109e, respectively.

In the comparative example, copper film 111 is formed in a state where residual step H occurs in silicon oxide film 103. Consequently, as shown in a frame A in FIG. 17, residual step H is reflected also in copper film 111 and a step occurs.

Figure 18:
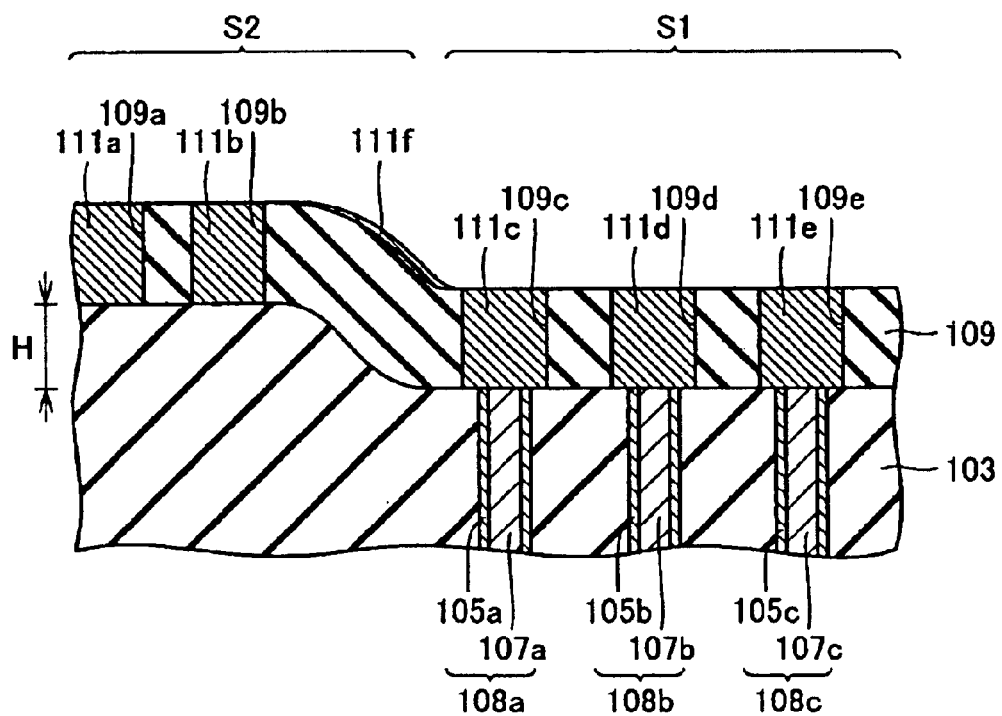
FIG. 18 is a cross section showing a process performed after the process illustrated in FIG. 17 in the second embodiment.

When copper film 111 is subjected to the polishing process in a state where a step occurs, there are cases that polishing cloth of the polishing apparatus cannot deal with the step portion. Consequently, as shown in FIG. 18, copper film 111 positioned in the step portion cannot be completely removed and it is feared that a residue 111f of the copper film occurs.

When residue 111f of the copper film occurs, for example, an inconvenience might arise such that neighboring lines 111b and 111c positioned while sandwiching the step portion are electrically short-circuited via residue 111f of the copper film. Reliability of the semiconductor device deteriorates.

In contrast, in the manufacturing method of the present invention, by performing the predetermined polishing process in consideration of pattern density of plugs 8a to 8c at the time of forming plugs 8a to 8c, residual step "h" is reduced.

It can suppress occurrence of a residue of copper film 11 in the polishing process performed at the time of forming lines 11a to 11e as in the comparative example. As a result, occurrence of, for example, an inconvenience such as electric short-circuit is suppressed and reliability of the semiconductor device can be assured.

By forming silicon oxide film 9 in which a groove is formed for a copper line on silicon oxide film 3 in which the residual step "h" is suppressed, variations in thickness of silicon oxide film 9 are also suppressed. Variations in the depth of the grooves formed in silicon oxide film 9 are also suppressed and the thickness of copper lines 11a to 11e becomes uniform. As a result, variations in wire resistance can be also suppressed.

Third Embodiment

In manufacture of a semiconductor device, there is a case that the polishing process is performed on the silicon oxide film formed so as to cover devices provided on a semiconductor substrate. In the silicon oxide film, a step (absolute step) occurs between a portion of the silicon oxide film covering the devices and the portion of the silicon oxide film which does not cover the devices.

A polishing process performed in the case where such an absolute step occurs will be described by using a comparative example.

Figure 19:
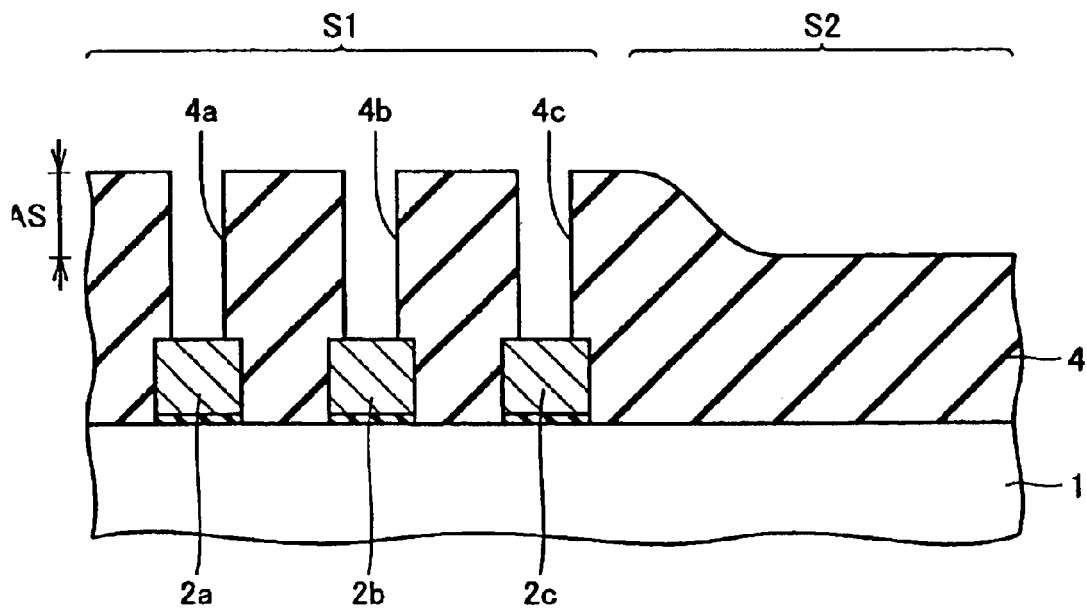
FIG. 19 is a cross section showing a process in a method of manufacturing a semiconductor device according to a third embodiment of the present invention.

First, as shown in FIG. 19, gate electrodes 2a to 2c of transistors are formed as an example of the devices on semiconductor substrate 1 via a gate insulating film. A silicon oxide film 4 is formed on semiconductor substrate 1 so as to cover gate electrodes 2a to 2c.

By forming silicon oxide film 4 so as to cover gate electrodes 2a to 2c, an absolute step AS occurs, so that the level of the surface of silicon oxide film 4 in a region S1 in which gate electrodes 2a to 2c (or plugs) are positioned is higher than that of the surface of silicon oxide film 4 in a region S2 in which gate electrodes 2a to 2c are not positioned.

Contact holes 4a to 4c from which the surface of gate electrodes 2a to 2c are exposed are formed in silicon oxide film 4.

Figure 20:
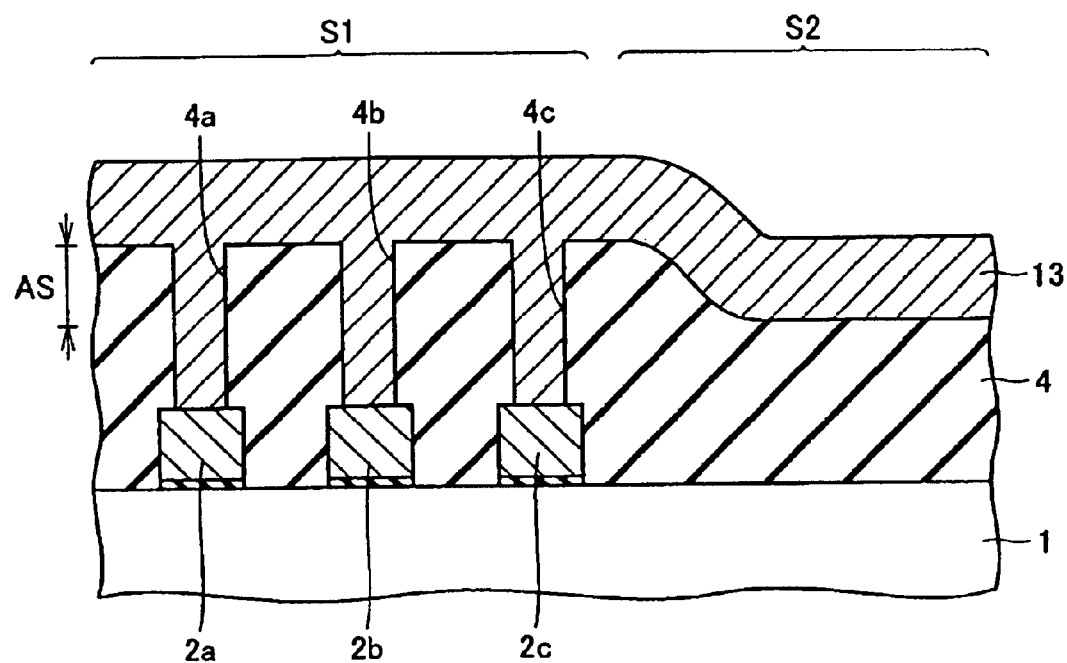
FIG. 20 is a cross section showing a process performed after the process illustrated in FIG. 19 in the third embodiment.

As shown in FIG. 20, a tungsten film 13 is formed on silicon oxide film 4 including side faces of contact holes 4a to 4c. Subsequently, tungsten film 13 and silicon oxide film 4 are subjected to the polishing process.

At this time, as described in the first embodiment, based on the relation between the residual step and pattern density preliminarily obtained, polishing parameters are determined from pattern density of plugs of tungsten and the maximum value of the required residual step after the polishing process.

Figure 21:
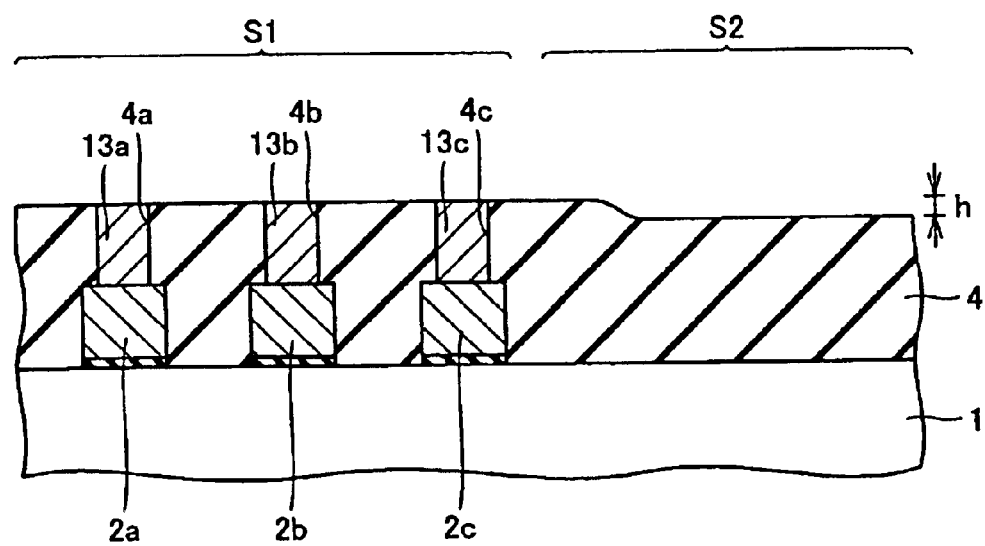
FIG. 21 is a cross section showing a process performed after the process illustrated in FIG. 20 in the third embodiment.

By performing the polishing process on tungsten film 13 and silicon oxide film 4 with the polishing parameters determined as described above, as shown in FIG. 21, the portion of tungsten film 13 positioned on the top face of silicon oxide film 4 is removed and plugs 13a to 13c are formed in contact holes 4a to 4c, respectively.

The residual step "h" between the level of the surface of region S1 in which plugs 13a to 13c are formed and the level of the surface of region S2 in which plugs 13a to 13c are not formed is equal to or less than the maximum value of the required residual step. In this case, by reflecting the initial absolute step shown in FIG. 19, the level of the surface of region S1 is higher than that of the surface of region S2.

Figure 22:
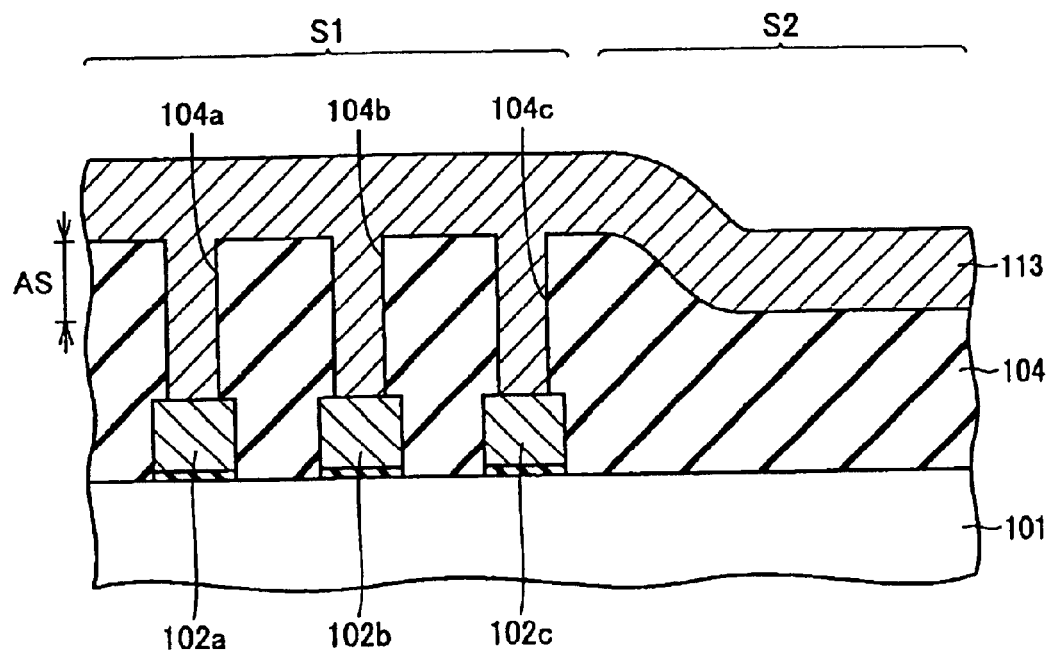
FIG. 22 is a cross section showing a process in a method of manufacturing a semiconductor device as a comparative example in the third embodiment.

A comparative example will now be described. First, in the process shown in FIG. 22 corresponding to FIG. 19, gate electrodes 102a to 102c are formed on a semiconductor substrate 101 via a gate insulating film. Silicon oxide film 104 is formed on semiconductor substrate 101 so as to cover gate electrodes 102a to 102c.

By forming silicon oxide film 104 so as to cover gate electrodes 102a to 102c, absolute step AS occurs. The level of the surface of silicon oxide film 104 in region S1 in which gate electrodes 102a to 102c (or plugs) are positioned is higher than that of the surface of silicon oxide film 104 in region S2 in which gate electrodes 102a to 102c are not positioned.

In silicon oxide film 104, contact holes 104a to 104e through which the surface of gate electrodes 102a to 102c and semiconductor substrate 101 are exposed are formed. On silicon oxide film 104, a tungsten film 113 is formed.

Figure 23:
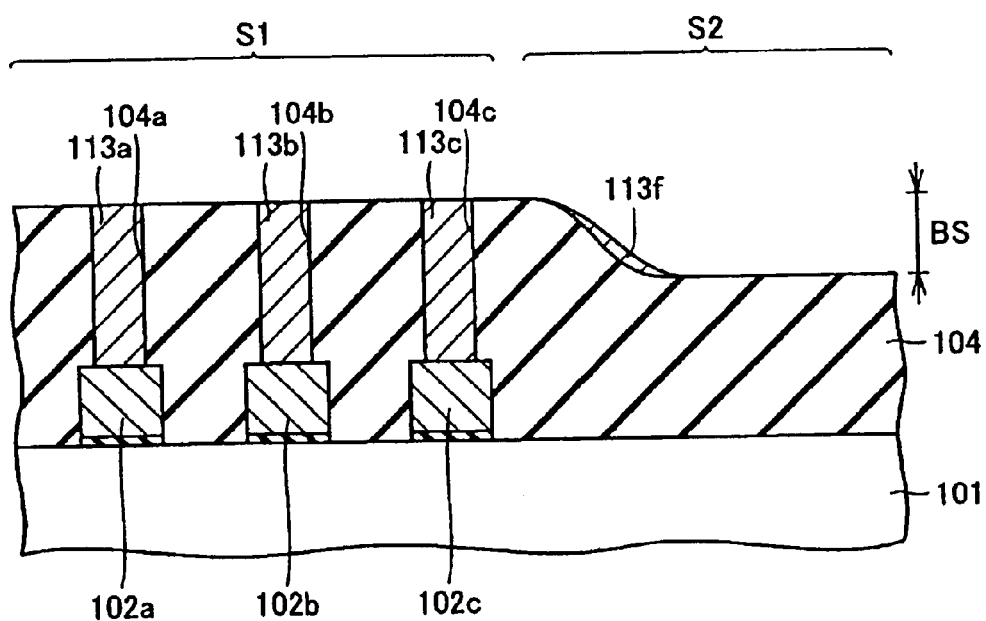
FIG. 23 is a cross section showing a process performed after the process illustrated in FIG. 22 in the third embodiment.

By performing the polishing process on tungsten film 113 and the like with a slurry having the function of polishing tungsten, as shown in FIG. 23, plugs 113a to 113c are formed in contact holes 104a to 104c, respectively.

In the conventional polishing process, there is no idea of setting the polishing parameters in consideration of pattern density of plugs 113a to 113c. According to the pattern density of plugs 113a to 113c, there is a case such that absolute step AS between region S1 in which plugs 113a to 113c are formed and region S2 in which plugs are not formed is not sufficiently reduced. As a result, a relatively large residual step BS might occur.

When relatively large residual step BS occurs, a residue 113f of the tungsten film tends to occur in the portion of the step. Residue 113f of the tungsten film 113f causes an electric short-circuit.

In contrast, in the manufacturing method of the present invention, based on the relation between the residual step and pattern density preliminarily obtained, with polishing parameters determined from the pattern density of plugs of tungsten and the maximum value of a required residual step after the polishing process, the polishing process is performed on tungsten film 13 and silicon oxide film 4.

As a result, a relatively large residual step does not occur unlike the comparative example, occurrence of residue 113f of the tungsten film is suppressed, and occurrence of an inconvenience such as an electric short-circuit caused by occurrence of residue 113f is prevented. As a result, reliability of the semiconductor device can be assured.

Although transistors having gate electrodes 2a to 2c are described as an example of devices, other devices such as capacitors may be alternately used.

Although plugs of tungsten have been described as an example of the conductive pattern in the foregoing embodiments, other than the plugs, the present invention can be also applied to wires. Further, as the conductive film, other than tungsten, another conductive film such as a copper film can be also used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming an insulating film on a main surface of a semiconductor substrate;

forming an opening for forming a predetermined conducive pattern in said insulating film;

forming a conductive film on said insulating film so as to bury said opening; and performing a polishing process on said conductive film and said insulating film by using a slurry having the function of polishing both said conductive film and said insulating film, thereby leaving said conductive film in said opening to form said predetermined conductive pattern, the method comprising performing the polishing process by:

predetermining a residual step in the polished insulating layer based upon the pattern density of the predetermined conductive pattern;

polishing, such that any step formed does not exceed the predetermined residual step, by controlling at least one polishing parameter, wherein the predetermined residual step is selected to reduce the formation of undesirable metal residue during formation of subsequent metal patterns above the predetermined residual step;

after polishing forming another insulating film on said insulating film so as to cover said conductive pattern;

forming another opening in said another insulating film; and forming a predetermined another conductive pattern by burying said another opening with another conductive film.

2. The method of manufacturing a semiconductor device according to claim 1, wherein said polishing parameters include at least one of the ratio between polishing speed at the time of polishing said conductive film and polishing speed at the time of polishing said insulating film, the kind of said insulating film, and a polishing parameter on the side of a polishing apparatus for performing a polishing process.

3. The method of manufacturing a semiconductor device according to claim 1, wherein tungsten is used for said conductive film, and copper is used for said another conductive film.

4. The method of manufacturing a semiconductor device according to claim 1, further comprising the step of forming a predetermined device in a region of a main surface of said semiconductor substrate before said insulating film is formed.

5. The method of manufacturing a semiconductor device according to claim 4, wherein the step of forming said predetermined device includes a step of forming a transistor having an electrode.

* * * * *